(12) United States Patent
Yang et al.

(10) Patent No.: US 8,949,056 B2
(45) Date of Patent: Feb. 3, 2015

(54) BATTERY MANAGEMENT SYSTEM AND BATTERY PACK INCLUDING BATTERY MANAGEMENT SYSTEM

(75) Inventors: Jongwoon Yang, Yongin-si (KR); Susumu Segawa, Yongin-si (KR)

(73) Assignee: Samsung SDI Co., Ltd., Giheung-gu, Yongin-si, Gyeonggi-do (KR)

( * ) Notice: Subject to any disclaimer, the term of this patent is extended or adjusted under 35 U.S.C. 154(b) by 501 days.

(21) Appl. No.: 13/200,380

(22) Filed: Sep. 23, 2011

(65) Prior Publication Data
US 2012/0158338 A1   Jun. 21, 2012

(30) Foreign Application Priority Data

Dec. 20, 2010   (KR) .................. 10-2010-0130957

(51) Int. Cl.
| | | |
|---|---|---|
| G01D 18/00 | (2006.01) | |
| G01N 27/416 | (2006.01) | |
| G01R 31/36 | (2006.01) | |
| G01R 35/00 | (2006.01) | |
| H02J 7/00 | (2006.01) | |

(52) U.S. Cl.
CPC ............ G01R 31/362 (2013.01); G01R 35/005 (2013.01); H02J 7/0021 (2013.01)
USPC ........................................... 702/85; 324/433

(58) Field of Classification Search
USPC ............... 702/85, 57, 60, 63–65, 81, 84, 104, 702/107–108, 116–117, 127, 182–184, 702/189; 320/116, 118–119, 123, 127–128, 320/130, 134–137, 157–159, 162–164; 324/426–427, 429–430, 433–434, 444; 322/17, 22–25, 27–28, 34, 37; 429/90–93, 99, 149, 152, 428–432
See application file for complete search history.

(56) References Cited

U.S. PATENT DOCUMENTS

| | | | |
|---|---|---|---|
| 7,173,429 B2 | 2/2007 | Kutkut et al. | |
| 7,696,725 B2 | 4/2010 | Liu et al. | |

FOREIGN PATENT DOCUMENTS

JP        2000356657         12/2000

(Continued)

OTHER PUBLICATIONS

Oleksandr Karpin, Power Management—Low-Cost, Two-Cell Li-Ion/Li-Pol Battery Charger with Cell-Balancing Support, Nov. 25, 2007, Cypress Perform, AN2309, 21 pp.*

(Continued)

*Primary Examiner* — Toan Le
(74) *Attorney, Agent, or Firm* — Robert E. Bushnell, Esq.

(57) ABSTRACT

A battery management system and a battery pack. The battery management system includes a micro computer unit including an analog-to-digital converter (ADC) to measure a battery voltage, a voltage generation unit to generate a power voltage of the ADC by using the battery voltage, a voltage measuring unit to measure the power voltage, and an error calibration unit to measure a variation of the power voltage, measured by the voltage measuring unit, by using a reference power voltage, and calibrate the battery voltage, measured by the ADC, by using the measured variation.

20 Claims, 2 Drawing Sheets

(56) References Cited

FOREIGN PATENT DOCUMENTS

| | | |
|---|---|---|
| JP | 2008191011 | 8/2008 |
| JP | 2009-178005 A | 8/2009 |
| KR | 1993-0018278 A | 2/1992 |
| KR | 2005-0056582 A | 6/2005 |
| KR | 2008-0034352 A | 4/2008 |
| KR | 2009-0085283 A | 8/2009 |

OTHER PUBLICATIONS

Korean Notice of Allowance issued on Apr. 10, 2012 in connection with Korean Patent Application Serial No. 10-2010-0130957 and Request for Entry of the Accompanying Office Action attached herewith.

Korean Office action issued on Nov. 21, 2011 by KIPO in the corresponding Korean application No. 2010-0130957.

* cited by examiner

BATTERY MANAGEMENT SYSTEM AND BATTERY PACK INCLUDING BATTERY MANAGEMENT SYSTEM

CLAIM OF PRIORITY

This application makes reference to, incorporates the same herein, and claims all benefits accruing under 35 U.S.C. §119 from an application for BATTERY MANAGEMENT SYSTEM AND BATTERY PACK INCLUDING BATTERY MANAGEMENT SYSTEM earlier filed in the Korean Intellectual Property Office on 20 Dec. 2010 and there duly assigned Korean Patent Application No. 10-2010-0130957.

BACKGROUND OF THE INVENTION

1. Field of the Invention

Embodiments relate to a battery management system and a battery pack including the same.

2. Description of the Related Art

In general, portable electronic equipment, such as laptop computers and hand-held power tools, are equipped with a rechargeable battery pack. The battery pack includes a plurality of battery cells, a voltage sensing and balancing circuit for sensing voltages of the battery cells and maintaining balancing, and a battery management system configured as a micro computer unit for controlling the charging and discharging of the battery cells.

In the case of a battery pack installed in special equipment such as a hand-held power tool, some of battery cells are connected to a voltage sensing and balancing circuit so that their voltages are measured. In general, these battery cells are directly connected to an analog-to-digital converter (ADC) provided inside a micro computer unit to thereby deliver the voltage values thereof.

A battery management system may undergo repetitive reset operations due to a drop in battery voltage. At this time, a system shutdown is required. However, under these circumstances, the power voltage of an ADC for measuring the battery voltage also varies, which makes it difficult to accurately measure a battery voltage value for determining a shutdown.

SUMMARY OF THE INVENTION

An aspect of the present invention provides a battery management system capable of accurately measuring a battery voltage even when a power voltage of an analog-to-digital converter (ADC) varies, and a battery pack including the battery management system.

According to one aspect of the present invention, there is provided a battery management system that includes a micro computer unit including an analog-to-digital converter (ADC) to measure a battery voltage, a voltage generation unit to generate a power voltage of the ADC by using the battery voltage, a voltage measuring unit to measure the power voltage; and an error calibration unit to measure a variation of the power voltage, measured by the voltage measuring unit, by using a reference power voltage, and calibrate the battery voltage, measured by the ADC, by using the measured variation.

The micro computer unit may also include a controller to output a control signal to allow the battery voltage to be applied to the ADC when the battery voltage is measured, and to allow the power voltage, generated by the voltage generation unit, to be applied to the voltage measuring unit by blocking an electrical path between the ADC and the voltage generation unit when a reset event occurs in the micro computer unit. The controller may include a switch unit that includes a diode including a cathode, and an anode connected to an output terminal of the voltage generation unit and an input terminal of the power voltage of the ADC and a transistor including a first electrode connected to the cathode of the diode, a second electrode connected to ground, and a control electrode connected to an output terminal of the controller.

The voltage measuring unit may include a Zener diode connected between an output terminal of the voltage generation unit and an input terminal of the error calibration unit. The error calibration unit may calibrate the digital value of the battery voltage by converting the power voltage, measured by the voltage measuring unit, into a digital value, calculating a variation rate of the digital value of the converted power voltage by using a digital value of a reference power voltage, and applying the variation rate to a digital value of the battery voltage converted by the ADC to thereby.

According to another aspect of the present invention, there is provided a battery pack that includes a battery including at least one battery cell and a battery management system to measure a battery voltage of the battery, control charging/discharging according to a value of the measured battery voltage, and being shut down when a reset event occurs, the battery managing system including a micro computer unit including an analog-to-digital converter (ADC) to measure the battery voltage, a voltage generation unit to generate a power voltage of the ADC by using the battery voltage, a voltage measuring unit to measure the power voltage and an error calibration unit to measure a variation of the power voltage measured by the voltage measuring unit by using a reference power voltage, and calibrate the battery voltage measured by the ADC by using the measured variation.

The micro computer unit may also include a controller to output a control signal to allow the battery voltage to be applied to the ADC when the battery voltage is measured, and to allow the power voltage generated by the voltage generation unit to be applied to the voltage measuring unit by blocking an electrical path between the ADC and the voltage generation unit when a reset event occurs in the micro computer unit. The controller may include a switch unit that includes a diode including a cathode, and an anode connected to an output terminal of the voltage generation unit and an input terminal of the power voltage of the ADC and a transistor including a first electrode connected to the cathode of the diode, a second electrode connected to a ground terminal, and a control electrode connected to an output terminal of the controller.

The voltage measuring unit may include a Zener diode connected between an output terminal of the voltage generation unit and an input terminal of the error calibration unit. The error calibration unit may calibrate the digital value of the battery voltage by converting the power voltage, measured by the voltage measuring unit, into a digital value, calculating a variation rate of the digital value of the converted power voltage by using a digital value of a reference power voltage, and applying the variation rate to a digital value of the battery voltage converted by the ADC.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Example embodiments will now be described more fully hereinafter with reference to the accompanying drawings, however, they may be embodied in different forms and should not be construed as limited to the embodiments set forth herein. Rather, these embodiments are provided so that this disclosure will be thorough and complete, and will fully convey the scope of the disclosure to those skilled in the art.

Hereinafter, embodiments will be described in detail with reference to the accompanying drawings.

Figure 1:
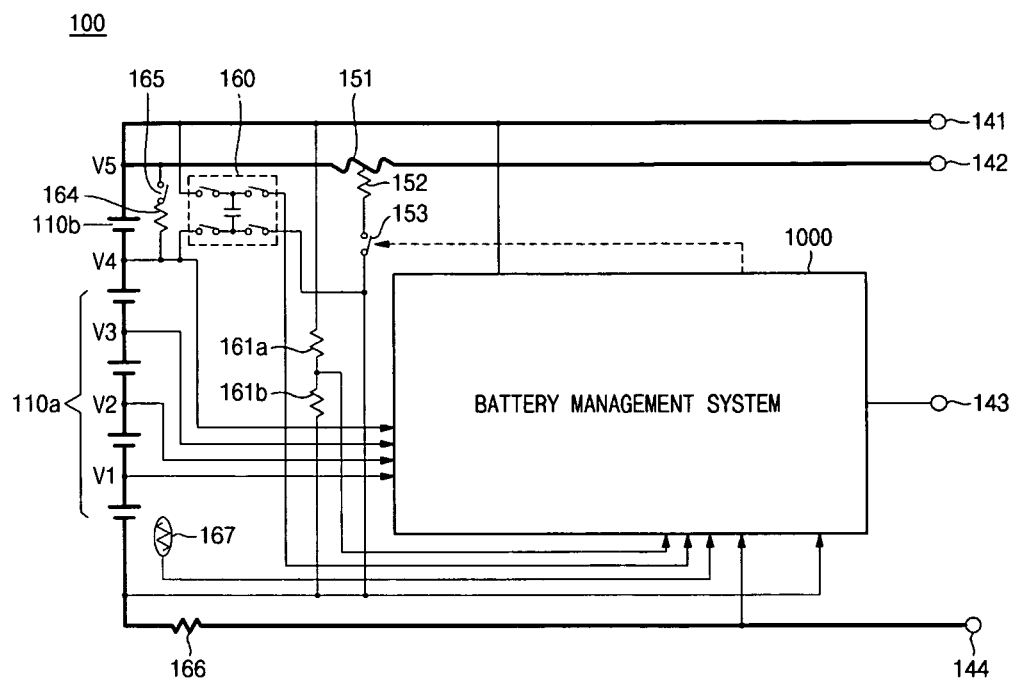
FIG. 1 illustrates a block diagram of a battery pack according to an embodiment of the present invention.

FIG. 1 illustrates a block diagram of a battery pack 100 according to an embodiment of the present invention. Referring to FIG. 1, the battery pack 100 according to an embodiment of the present invention may include a battery (see reference numerals 110a and 110b in FIG. 1), and a battery management system 1000.

The battery may include one or more battery cells 110a and 110b. The battery cells and 110a and 110b are connected in series and can be repeatedly recharged by energy. Each of the battery cells 110a and 110b, although not limited thereto, may be a lithium ion battery cell rechargeable up to approximately 4.2V. In this embodiment of the present invention, the plurality of battery cells 110a and 110b are described by grouping them into four first battery cells 110a, and one second battery cell 110b, which is the fifth battery cell, all connected in series.

Figure 2:
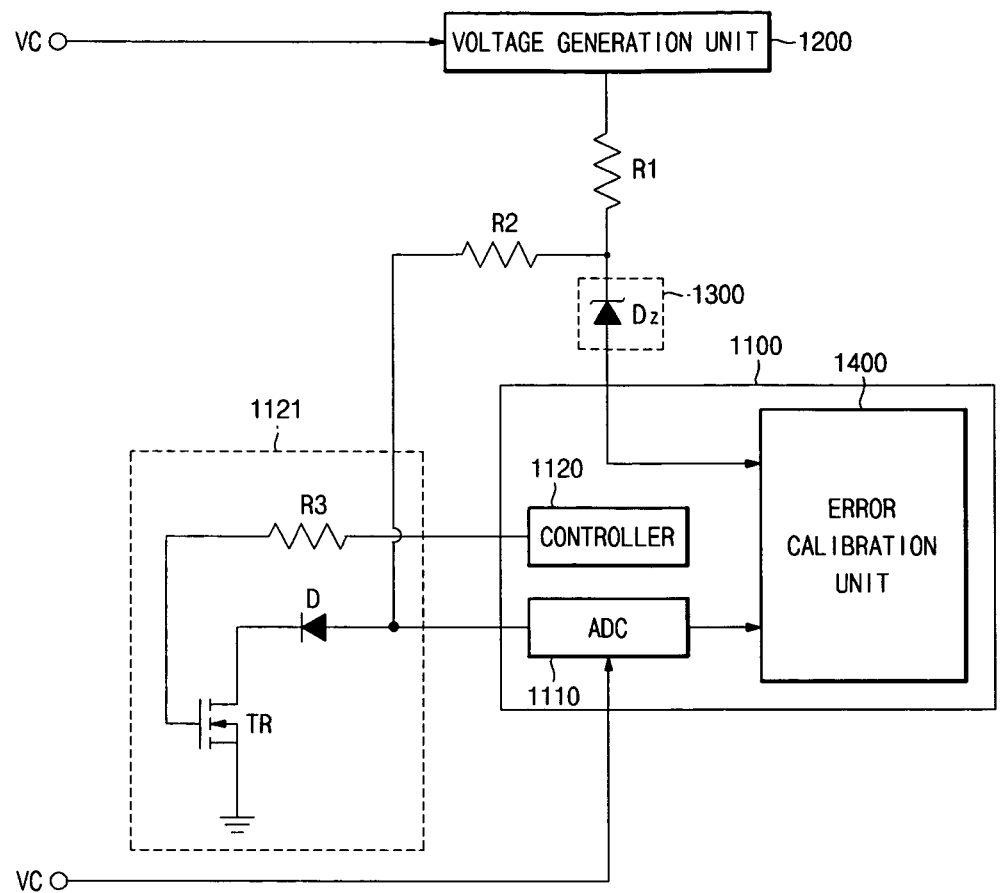
FIG. 2 illustrates a block diagram of a battery management system of FIG. 1 according to an embodiment of the present invention.

The battery management system 1000 may include an Analog Front End (AFE) (not shown), and a Micro Computer Unit (MCU) 1100 (see FIG. 2).

The AFE may perform voltage balancing while sensing voltages of the first battery cells 110a. The AFE may supply power to the MCU, and deliver sensed voltage information from the first battery cells 110a to an Analog-to Digital Converter (ADC) of the MCU. The AFE, although not limited thereto, may utilize various types of AFEs manufactured for lithium ion batteries.

The MCU may include the ADC. The MCU may provide the AFE with a balancing control signal and a charging/discharging control signal corresponding to data processed by a program or an algorithm. The data processed by a program or an algorithm may be voltage information regarding the battery cells 110a and 110b. The MCU, although not limited thereto, may utilize various types of micro computers manufactured for lithium ion batteries.

The battery pack 100 may include a discharge terminal 141 for discharging the battery cells 110a and 110b, a charge terminal 142 for charging the battery cells 110a and 110b, a communication terminal 143 for conducting single-wire communication with an external device, and a negative terminal 144 for charging or discharging the battery cells 110a and 110b. The discharge terminal 141 and the charge terminal 142 may be electrically connected to anodes of the battery cells 110a and 110b. The negative terminal 144 may be electrically connected to a cathode of the battery cells 110a and 110b. The communication terminal 143 may be electrically connected to the MCU 1100.

The battery pack 100 may include a fuse 151 connected between the charge terminal 142 and the battery cells 110a and 110b in order to prevent overcharge. As shown in FIG. 1, a resistor 152 and a switch 153 may be connected to the fuse 151. The switch 153 may be turned ON or OFF in response to a control signal of a battery management system 1000. Such an overcharge prevention member is not limited to the above configuration, and may be configured using a plurality of field-effect transistors.

Battery pack 100 may also include voltage-dividing resistors 161a, 161b connected between the discharge terminal 141 and the negative electrode terminal 144, where voltage-dividing resistors 161a, 161b output an overall voltage of the battery pack 100 to the battery management system 1000.

The battery pack 100 of the present invention may also include a balancing resistor 164 and a balancing switch 165 for balancing of the second battery cell 110b. That is, the balancing resistor 164 and the balancing switch 165 are electrically connected between the positive electrode and the negative electrode of the second battery cell 110b. The balancing switch 165 may be turned-on or turned-off in response to control signals from the battery management system 1000.

The battery pack 100 of the present invention may also include a current sensing resistor 166 for sensing currents of the first and second battery cells 110a, 110b, and a temperature sensor 167 for sensing temperatures of the first and second battery cells 110a, 110b.

The battery pack 100 according to an embodiment of the present invention includes the five battery cells V1, V2, V3, V4 and V5 connected in series. That is, as described above, the battery pack 100 may include first battery cells 110a (first through fourth battery cells V1, V2, V3 & V4), and the second battery cell 110b, the fifth battery cell V5. However, AFEs, which have been developed so far, are designed to sense voltage of the first battery cells 110a only. Namely, without a circuit modification, a voltage of the second battery cell 110b cannot be detected.

Therefore, in order to sense the voltage of the second battery cell 110b, the battery pack 100, according to an embodiment of the present invention, may further include an analog switch unit 160. The analog switch unit 160 may be connected in parallel between an anode and a cathode of the second battery cell 110b. The analog switch unit 160 may sense and store the voltage of the second battery cell 110b, and deliver it to an ADC (not shown) of the battery management system 1000.

Hereinafter, the construction of the battery management system 1000 of the battery pack 100 of FIG. 1 will be described in more detail in FIG. 2. FIG. 2 illustrates a block diagram of a battery management system 1000 according to an embodiment of the present invention. Referring to FIG. 2, the battery management system 1000 according to an embodiment of the present invention includes a MCU 1100, a voltage generation unit 1200, a voltage measuring unit 1300, and an error calibration unit 1400.

The MCU 1100 may include an ADC 1110 for measuring a battery voltage VC, and a controller 1120, where battery voltage VC=V1+V2+V3+V4+V5. The ADC 1110 may measure a battery voltage VC and convert the measured battery voltage VC into a digital value ($VC_{\_ADC}$). Subsequently, the MCU 1100 may calibrate the digital value ($VC_{\_ADC}$) converted by the ADC 1110 through the error calibration unit 1400, and then make a determination regarding a shutdown on the basis of the calibrated digital value ($VC_{\_ADC}$).

For measuring the battery voltage VC, the controller 1120 may provide control to apply the power voltage ($V_{reg}$) to the ADC 1110. Furthermore, when a reset event occurs in the MCU 1100, the controller 1120 may provide control to apply a power voltage ($V_{reg}$), generated by the voltage generation unit 1200, to the voltage measuring unit 1300 by blocking an electrical path between the ADC 1110 and the voltage generation unit 1200.

The controller 1120 may include a switch unit 1121 for performing the above operations. The switch unit 1121 may include a diode D and a transistor TR.

The diode D may include a cathode terminal and an anode terminal. The anode terminal may be electrically connected to an output terminal of the voltage generation unit 1200 and an input terminal of the ADC 1110. Here, the power voltage ($V_{reg}$) of the ADC 1110 may be output from the output terminal of the voltage generation unit 1200, and be input to the input terminal of the ADC 1110. The power voltage ($V_{reg}$) may be used as a reference voltage of the ADC 1110.

The transistor TR may include a first electrode, a second electrode, and a control electrode. The first electrode may be electrically connected to the cathode terminal of the diode D, the second electrode may be electrically connected to ground, and the control electrode may be electrically connected to an output terminal of the controller 1120.

The output terminal of the controller 1120 outputs a control signal to switch unit 1121, and the switch unit 1121 may be turned ON or OFF according to the control signal. For example, in the case where the transistor TR of the switch unit 1121 is an NMOS transistor, a High control signal is applied to the output terminal of the controller 1120 to thereby turn OFF the transistor TR. In this case, the ADC 1110 and the voltage generation unit 1200 electrically float with respect to each other, and thereby, the power voltage ($V_{reg}$) from the voltage generation unit 1200 can be applied to the voltage measuring unit 1300 without being applied to the input terminal of the ADC 1110. Furthermore, in the case where the control signal is a Low signal, the transistor TR is turned ON to thereby allow the power voltage ($V_{reg}$) from the voltage generation unit 1200 to be applied to the ADC 1110.

Meanwhile, the error calibration unit 1400 in FIG. 2 is illustrated as being installed inside the MCU 1100, but this illustration is merely one example and the installation thereof is not limited thereto. The error calibration unit 1400 may instead be installed outside the MCU 1100.

The voltage generation unit 1200 may generate a power voltage ($V_{reg}$) for the ADC 1110 by using the battery voltage VC. The voltage generation unit 1200 may comprise a voltage divider having a plurality of resistors in order to produce the power voltage ($V_{reg}$) from the battery voltage VC. The power voltage ($V_{reg}$) may be used as a reference voltage of the ADC 1110.

The voltage measuring unit 1300 may measure the power voltage ($V_{reg}$) generated by the voltage generation unit 1200. This voltage measuring unit 1300 may be configured between the voltage generation unit 1200 and the MCU 1100. Here, the MCU 1100 may deliver the power voltage ($V_{reg}$), measured by the voltage measuring unit 1300, to the error calibration unit 1400. Alternatively, the power voltage ($V_{reg}$) measured by the voltage measuring unit 1300 may be directly input to the error calibration unit 1400.

The voltage measuring unit 1300 may include a Zener diode (Dz) for measuring the power voltage ($V_{reg}$) generated by the voltage generation unit 1200. The Zener diode Dz may include a cathode terminal and an anode terminal. The cathode terminal may be electrically connected to the output terminal of the voltage generation unit 1200. The anode terminal may be electrically connected to an input terminal of the error calibration unit 1400. The power voltage ($V_{reg}$) measured by the voltage measuring unit 1300 may be input to the input terminal of the error calibration unit 1400.

The error calibration unit 1400 may calculate a variation of the power voltage ($V_{reg}$), measured by the voltage measuring unit 1300, by using a reference power voltage, and calibrate the battery voltage VC, measured by the ADC 1110, by using the calculated information. Here, the reference power voltage is a reference for measuring a variation of the power voltage ($V_{reg}$) measured by the voltage measuring unit 1300.

A detailed configuration of the error calibration unit 1400 is as follows. The error calibration unit 1400 may convert a value of the power voltage ($V_{reg}$), measured by the voltage measuring unit 1300, into a digital value on the basis of Equation 1 below:

$$V_{reg\_ADC} = \left(\frac{V_Z}{V_{reg}} \times 2^n\right) \quad \text{(Equation 1)}$$

In Equation 1, $V_{reg\_ADC}$ may denote the digital value of the power voltage ($V_{reg}$) measured by the voltage measuring unit 1300, $V_Z$ may denote a breakdown voltage value of the Zener diode (Dz) 1300, and $V_{reg}$ may denote a value of the power voltage ($V_{reg}$) measured by the voltage measuring unit 1300. Also, n may denote a bit number of the ADC 1110.

Thereafter, the error calibration unit 1400 may calculate a variation rate of the digital value of the converted power voltage by using a digital value of a reference power voltage on the basis of Equation 2 below:

$$\% V_{reg\_ADC} = \left(\frac{\Delta V_{reg\_ADC}}{2^n}\right) \times \frac{1}{100} \quad \text{(Equation 2)}$$

Equation 2, $\% V_{reg\_ADC}$ may denote the variation rate of the digital value of the converted power voltage, and $\Delta V_{reg\_ADC}$ may denote a variation of the digital value ($V_{reg\_ADC}$) of the converted power voltage. Here, the error calibration unit 1400 may calculate the variation ($\Delta V_{reg\_ADC}$) on the basis of Equation 3 below:

$$\Delta V_{reg\_ADC} = |V_{reg\_ADC} - V_{reg\_ADC\_ref}| \quad \text{(Equation 3)}$$

In Equation 3, $V_{reg\_ADC\_ref}$ may denote a digital value of a reference power voltage, the reference power voltage being a reference for measuring a variation of the power voltage ($V_{reg}$) measured by the voltage measuring unit 1300. The digital value ($V_{reg\_ADC\_ref}$) of the reference power voltage may be stored in the error calibration unit 1400 in advance, and may be obtained by converting a value of a normal power voltage, a constant power voltage ($V_{reg}$) generated from the voltage generation unit 1200, into a digital value.

The error calibration unit 1400 may apply the variation rate ($\% V_{reg\_ADC}$) to a digital value ($VC_{\_ADC}$) of a battery voltage converted by the ADC 1110 to thereby calibrate the digital value of the battery voltage. Here, the error calibration unit 1400 may calibrate the digital value ($VC_{\_ADC}$) of the battery voltage converted by the ADC on the basis of Equation 4 below:

$$VC'_{\_ADC} = VC_{\_ADC} \pm \left[VC_{\_ADC} \times \left(\frac{1}{\% V_{reg\_ADC}}\right)\right] \quad \text{(Equation 4)}$$

In Equation 4, $VC_{\_ADC}'$ may denote an adjusted digital value of the battery voltage, and $VC_{\_ADC}$ may denote the digital value of the battery voltage VC measured by the ADC 1110. Here, the digital value ($VC_{\_ADC}$) of the battery voltage may be obtained by converting a value of a battery voltage measured before the switch unit 1121 is turned off upon a reset event occurring in the MCU 1100, the digital value $VC_{\_ADC}$ may be delivered from the ADC 1110 to the error calibration unit 1400.

The error calibration unit 1400 may selectively perform an operation based on Equation 4 depending on an increase or decrease in the power voltage ($V_{reg}$). For example, when it is determined that power voltage ($V_{reg}$) measured by the voltage measuring unit 1300 decreases lower than the reference power voltage, the error calibration unit 1400 may perform a calibration process based on Equation 5 below:

$$VC'_{\_ADC} = VC_{\_ADC} - \left[VC_{\_ADC} \times \left(\frac{1}{\% V_{reg\_ADC}}\right)\right] \quad \text{(Equation 5)}$$

Also, when it is determined that the power voltage ($V_{reg}$) measured by the voltage measuring unit 1300 increases higher than the reference power voltage, the error calibration unit 1400 may perform a calibration process based on Equation 6, below:

$$VC'_{\_ADC} = VC_{\_ADC} + \left[VC_{\_ADC} \times \left(\frac{1}{\% V_{reg\_ADC}}\right)\right] \quad \text{(Equation 6)}$$

The calibration performed by the error calibration unit 1400 based on Equations 5 and 6 is associated with the case where a variation in the power voltage ($V_{reg}$) and a digital value ($V_{reg\_ADC}$) of the power voltage ($V_{reg}$) are in inverse proportion to each other. This inverse proportion may be achieved according to the power voltage ($V_{reg}$), the breakdown voltage ($V_z$) of the Zener diode Dz, and the bit number n of the ADC 1110. In an embodiment of the present invention, calculation algorithms as in Equations 5 and 6 are obtained, assuming that power voltage ($V_{reg}$) is set to 2.5 V, the breakdown voltage (Vz) of the Zener diode Dz is set to 2 V, and the bit number n of the ADC 1110 is set to 12.

The battery management system 1000 may generate the power voltage ($V_{reg}$) of the ADC 1110 by using the battery voltage VC. The drop in battery voltage VC may bring about repetitive reset operations in the battery management system 1000. In this case, a shutdown of the battery management system 1000 may be required. However, the drop in battery voltage VC varies the power voltage ($V_{reg}$), which makes it difficult to accurately measure a battery voltage VC for a determination regarding a shutdown.

According to an embodiment of the present invention, even in the case where the drop in battery voltage VC causes a variation in the power voltage ($V_{reg}$) of the ADC 1110, the variation rate of the power voltage is calculated, and information regarding the calculated variation rate is applied to a measured battery voltage to calibrate the battery voltage accordingly, thereby obtaining an accurate battery voltage. Thus, since an accurate battery voltage is obtained, even when the power voltage ($V_{reg}$) of the ADC 1110 varies, an accurate determination regarding a shutdown for the repetitive reset operation can be made.

As set forth herein, according to an embodiment of the present invention, there can be provided a battery management system, capable of accurately measuring a battery voltage even when the power voltage of the ADC varies, and a battery pack including the battery management system.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present disclosure as set forth in the following claims.

What is claimed is:

1. A battery management system, comprising:
    a microcomputer unit (MCU) including an analog-to-digital converter (ADC) to measure a battery voltage;
    a voltage generation unit to generate a power voltage of the ADC by using the battery voltage;
    a voltage measuring unit to measure the power voltage; and
    an error calibration unit to measure a variation of the power voltage, measured by the voltage measuring unit, by using a reference power voltage, and to calibrate the battery voltage, measured by the ADC, by using the measured variation.

2. The battery management system of claim 1, wherein the MCU further comprises a controller to output a control signal to allow the power voltage to be applied to the ADC when the battery voltage is measured, and to allow the power voltage, generated by the voltage generation unit, to be applied to the voltage measuring unit by blocking an electrical path between the ADC and the voltage generation unit when a reset event occurs in the MCU.

3. The battery management system of claim 2, wherein the controller includes a switch unit comprising:
    a diode including a cathode, and an anode connected to both an output terminal of the voltage generation unit and an input terminal of the power voltage of the ADC; and
    a transistor including a first electrode connected to the cathode of the diode, a second electrode connected to ground, and a control electrode connected to an output terminal of the controller.

4. The battery management system of claim 1, wherein the voltage measuring unit comprises a Zener diode connected between an output terminal of the voltage generation unit and an input terminal of the error calibration unit.

5. The battery management system of claim 4, the error calibration unit to calibrate a digital value of the battery voltage by converting the power voltage measured by the voltage measuring unit into the digital value, to calculate a variation rate of the digital value of the converted power voltage by using a digital value of a reference power voltage, and to apply the variation rate to a digital value of the battery voltage measured by the ADC.

6. The battery management system of claim 1, wherein the power voltage is generated from the battery voltage, wherein the calibrating of the battery voltage is to compensate for errors in measuring the battery voltage by the ADC due to fluctuations in the power voltage that powers the ADC.

7. The battery management system of claim 1, wherein the MCU to make a determination regarding a shutdown based on the calibrated battery voltage.

8. The battery management system of claim 1, the reference power voltage being obtained by converting a normal battery voltage into a corresponding power voltage, and then converting the power voltage corresponding to the normal battery voltage into a digital value.

9. The battery management system of claim 1, the power voltage being proportional to the battery voltage and being obtained by voltage dividing the battery voltage.

10. A battery pack, comprising:

a battery including at least one battery cell; and a battery management system to measure a battery voltage of the battery, control charging/discharging according to a value of the measured battery voltage, and to shut down when a reset event occurs, the battery management system including:

a microcomputer unit (MCU) including an analog-to-digital converter (ADC) to measure the battery voltage;

a voltage generation unit to generate a power voltage of the ADC by using the battery voltage;

a voltage measuring unit to measure the power voltage; and an error calibration unit to measure a variation of the power voltage measured by the voltage measuring unit by using a reference power voltage, and to calibrate the battery voltage measured by the ADC by using the measured variation.

11. The battery pack of claim 10, wherein the MCU further comprises a controller to output a control signal to allow the power voltage to be applied to the ADC when the battery voltage is measured, and to allow the power voltage generated by the voltage generation unit to be applied to the voltage measuring unit by blocking an electrical path between the ADC and the voltage generation unit when a reset event occurs in the MCU.

12. The battery pack of claim 11, wherein the controller includes a switch unit comprising:

a diode including a cathode, and an anode connected to both an output terminal of the voltage generation unit and an input terminal of the power voltage of the ADC: and a transistor including a first electrode connected to the cathode of the diode, a second electrode connected to a ground terminal, and a control electrode connected tc an output terminal of the controller.

13. The battery pack of claim 10, wherein the voltage measuring unit comprises a Zener diode connected between an output terminal of the voltage generation unit and an input terminal of the error calibration unit.

14. The battery pack of claim 13, the error calibration unit to calibrate a digital value of the battery voltage by converting the power voltage measured by the voltage measuring unit into the digital value, to calculate a variation rate of the digital value of the converted power voltage by using a digital value of a reference power voltage, and to apply the variation rate to a digital value of the battery voltage measured by the ADC.

15. The battery pack of claim 10, wherein the calibrating of the battery voltage is to compensate for errors in measuring the battery voltage by the ADC due to fluctuations in the power voltage that powers the ADC.

16. The battery pack of claim 10, wherein the MCU to make a determination regarding a shutdown based on the calibrated battery voltage.

17. The battery pack of claim 10, the reference power voltage being obtained by converting a normal battery voltage into a corresponding power voltage, and then converting the power voltage corresponding to the normal battery voltage into a digital value.

18. A battery pack, comprising:

a battery including at least one battery cell; and a battery management system to measure a battery voltage of the battery, control charging/discharging according to a value of the measured battery voltage, and to shut down when a reset event occurs, the battery management system including:

an analog-to-digital converter (ADC) to convert the battery voltage into a digital value;

a voltage generation unit to generate a power voltage from the battery voltage, the power voltage to power the ADC;

a voltage measuring unit to measure the power voltage; and an error calibration unit to determine a variation of the measured power voltage by using a reference power voltage, and to adjust the digital value of the battery voltage produced by the ADC according to the determined variation.

19. The battery pack of claim 18, the error calibration unit to determine the variation of the power voltage by:

converting the measured power voltage into a digital value; and determining the variation by comparing the digitized measured power voltage with the reference power voltage.

20. The battery pack of claim 19, the power voltage being proportional to the battery voltage, the reference power voltage being obtained by converting a normal battery voltage into a corresponding power voltage, and then converting the power voltage corresponding to a normal battery voltage into a digital value.

* * * * *